US007548066B2

(12) United States Patent
Ichimura et al.

(10) Patent No.: US 7,548,066 B2
(45) Date of Patent: Jun. 16, 2009

(54) POTENTIAL MEASURING DEVICE AND IMAGE FORMING APPARATUS USING THE SAME

(75) Inventors: Yoshikatsu Ichimura, Tokyo (JP); Takashi Ushijima, Yokohama (JP); Atsushi Kandori, Ebina (JP); Yoshitaka Zaitsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 282 days.

(21) Appl. No.: 11/430,992

(22) Filed: May 10, 2006

(65) Prior Publication Data

US 2006/0267593 A1 Nov. 30, 2006

(30) Foreign Application Priority Data

May 16, 2005 (JP) ............................ 2005-142011

(51) Int. Cl.
*G01R 29/12* (2006.01)
*G03G 15/00* (2006.01)
*G03G 15/06* (2006.01)

(52) U.S. Cl. ......................... 324/458; 324/457; 399/48; 399/56

(58) Field of Classification Search ................. 324/458, 324/457; 399/48, 56
See application file for complete search history.

(56) References Cited

U.S. PATENT DOCUMENTS 3,852,667 A 12/1974 Williams et al.
4,205,267 A 5/1980 Williams .................... 324/458
4,470,009 A * 9/1984 Takayanagi et al. ........... 324/72
4,720,682 A 1/1988 Ikushima et al.
4,724,393 A * 2/1988 Kumada et al. ............. 324/458
4,763,078 A 8/1988 Williams .................... 324/458
4,835,461 A 5/1989 Snelling ..................... 324/109
4,894,607 A * 1/1990 Kumada ...................... 324/96
5,151,659 A * 9/1992 Tanaka et al. ............... 324/458
5,212,451 A 5/1993 Werner, Jr. .................. 324/458
5,317,152 A 5/1994 Takamatsu et al. .......... 250/306
5,357,108 A 10/1994 Suzuki et al. ............... 250/306

(Continued)

FOREIGN PATENT DOCUMENTS

WO 2004/088333 A1 10/2004

(Continued)

OTHER PUBLICATIONS

Hsu, et al., "Micromechanical Electrostatic Voltmeter", Dept. of Electrical Engineering and Computer Sciences, University of California, Berkeley, CA, pp. 659-662 (1991).

(Continued)

*Primary Examiner*—Amy He
(74) *Attorney, Agent, or Firm*—Fitzpatrick, Cella, Harper & Scinto

(57) ABSTRACT

A potential measuring device for measuring a potential of a measurement object, includes a detection electrode that faces the measurement object, a reference electrode disposed in a vicinity of the detection electrode that is electrostatically shielded by an electrostatic shield structure with respect to the measurement object, and capacitance modulator for modulating an electrostatic coupled capacitance between the detection electrode and the measurement object to measure a potential of the measurement object by using an electric signal generated on the detection electrode and an electric signal generated on the reference electrode.

13 Claims, 10 Drawing Sheets

U.S. PATENT DOCUMENTS

| | | | | |
|---|---|---|---|---|
| 5,554,851 | A | 9/1996 | Hirai et al. | 250/442.11 |
| 5,574,279 | A | 11/1996 | Ikeda et al. | 250/306 |
| 5,923,637 | A | 7/1999 | Shimada et al. | 369/126 |
| 6,046,972 | A | 4/2000 | Kuroada et al. | 369/126 |
| 6,163,519 | A | 12/2000 | Kuroda et al. | 369/126 |
| 6,177,800 | B1 | 1/2001 | Kubby et al. | |
| 6,337,477 | B1 | 1/2002 | Shimada et al. | 250/216 |
| 6,806,717 | B2 | 10/2004 | Werner, Jr. et al. | 324/458 |
| 6,831,765 | B2 | 12/2004 | Yasuda et al. | 359/224 |
| 6,965,239 | B2 | 11/2005 | Yasuda et al. | 324/458 |
| 7,242,882 | B2 | 7/2007 | Ichimura et al. | 399/48 |
| 2003/0042907 | A1 | 3/2003 | Kieres et al. | 324/458 |
| 2005/0046918 | A1 | 3/2005 | Yasuda et al. | 359/224 |
| 2005/0174209 | A1 | 8/2005 | Teshima et al. | 336/200 |
| 2006/0001432 | A1 | 1/2006 | Yasuda et al. | 324/458 |
| 2006/0008284 | A1 | 1/2006 | Ushijima et al. | 399/48 |
| 2007/0170925 | A1 | 7/2007 | Kandori et al. | 324/457 |

FOREIGN PATENT DOCUMENTS

| | | | |
|---|---|---|---|
| WO | 2004/088335 | A1 | 10/2004 |

OTHER PUBLICATIONS

Riehl, "Microsystems for Elecvtrostatic Sensing", Dissertation, Engineering and Computer Sciences, Graduate Division, Univ. of California, pp. 1-110 (2002).

* cited by examiner

POTENTIAL MEASURING DEVICE AND IMAGE FORMING APPARATUS USING THE SAME

This application claims priority from Japanese Patent Application No. 2005-142011, filed on May 16, 2005, which is hereby incorporated by reference herein.

BACKGROUND OF THE INVENTION

1. Field of the Invention

The present invention relates to a potential measuring device of a non-contact type for measuring a potential of a measurement object based on a quantity of charge induced on a detection electrode, and, also, to an image forming apparatus having the potential measuring apparatus, which can be applied to a copying machine or a printer.

2. Related Background Art

In the prior art, for example, in an image forming apparatus having a photosensitive drum for conducting image formation by electrophotography, in order to constantly obtain a stable image quality, it is necessary to keep the potential of the photosensitive drum to be appropriately (generally uniformly) charged in any environment. For that reason, a potential measuring device is used to measure the charge potential of the surface of a photosensitive drum, and the result of the measurement is used to perform feedback control to thereby keep the potential of the photosensitive drum uniform.

The conventional potential measuring device includes a non-contact type potential measuring device, in which a system called a mechanically modulated alternating electrical field induction type is frequently used. In this system, the electrical potential of a surface of a measurement object is expressed as a function of the magnitude of a current i extracted from a detection electrode incorporated into the potential measuring device. The electrical potential is expressed by the following expression.

$$i = \frac{dQ}{dt} = \frac{d}{dt} \cdot (C \cdot V) \quad (1)$$

In the above expression, Q is a charge quantity that develops on the detection electrode, C is a coupled capacitance between the detection electrode and the measurement object, and V is a surface potential of the measurement object. Also, the capacitance C is expressed by the following expression.

$$C = \frac{A \cdot S}{x} \quad (2)$$

In the above expression, A is a proportional constant related to a dielectric constant of a material, and so on, S is an area of the detection electrode, and x is a distance between the detection electrode and the measurement object.

Those relationships are used to measure the potential V of the surface of the measurement object. It is known that it is preferable to cyclically modulate the magnitude of the capacitance C between the detection electrode and the measurement object, in order to accurately measure the charge quantity Q that develops on the detection electrode. That is, the charge quantity Q that develops on the detection electrode has such a small value as to be susceptible to noises that exist around the detection electrode. Therefore, in order to accurately measure a charge quantity Q having a small quantity, a synchronous detection system is often used, in which the magnitude of the coupled capacitance C between the detection electrode and the measurement object is cyclically modulated by an appropriate means, and components of the same frequency are detected from the measured signal, to thereby obtain a necessary signal.

As a method of modulating the capacitance C, the following methods are known.

U.S. Pat. No. 4,720,682 discloses a method in which a grounded fork-shaped shutter is inserted between the measurement object and the detection electrode, and the shutter cyclically moves in a direction parallel to the surface of the measurement object to thereby realize modulation of the coupled capacitance C between the measurement object and the detection electrode.

U.S. Pat. No. 3,852,667 discloses a structure in which a metal shield material having an aperture is disposed at a position facing the measurement object, and a detection electrode is disposed at a leading edge of a fork-shaped oscillating element, to thereby change the position of the detection electrode immediately below the aperture in a parallel direction. With the above structure, the number of electrical lines of force reaching the detection electrode is modulated, and the electrostatic capacitance C is modulated.

On the other hand, in order to downsize the electrophotography image forming apparatus, it is necessary to downsize the photosensitive drum and to increase packaging density around the drum, and the potential measuring device is also required to be made more compact and thinner. However, in the above-mentioned sensor of the mechanically modulated alternating electrical field induction type, assembling parts such as a driving mechanism for oscillating the fork-shaped shutter or the fork-shaped oscillating body take up most of the internal space of the sensor structure. Accordingly, it is necessary to downsize those driving mechanisms in order to downsize the potential measuring device.

Along with an increase in the demand for the above downsizing, in recent years, there has been reported an attempt to form a micro mechanical structure on a semiconductor substrate by using a semiconductor processing technology called "micro electro mechanical system (MEMS)" technology. There has also been reported a mechanically modulated alternating electrical field induction type potential measuring device using the above technology. As a typical example thereof, U.S. Pat. No. 6,177,800 discloses a device in which a shutter structure having a minute aperture, which has been manufactured through the semiconductor processing technology, is oscillated immediately above a detection electrode to measure the potential of a measurement object.

In the potential measuring device of the mechanically modulated alternating electrical field induction type using the above conventional art, in order to oscillate a fork-shaped shutter or a shutter having an aperture formed therein just above a detection electrode, an electromagnetic force, a generative force due to a piezoelectric element, or an electrostatic force is frequently used.

In the general potential measuring device described in the above example, a piezoelectric element is attached onto a fork-shaped shutter, and the fork-shaped shutter is oscillated by using the mechanical oscillation generated by a voltage which is applied to the piezoelectric element. At this time, an AC voltage of several volts to several tens of volts, or higher, is applied to the piezoelectric element, which causes AC noises to be generated in the detection electrode and to be superimposed on the detection signal. The noise frequently has the same frequency component as that of the detection signal, so it is not easy to remove the noise from the detection signal.

Likewise, in the system of oscillating the above-mentioned fork-shaped shutter with the use of an electromagnet, the detection signal is susceptible to noises generated by a current for driving the electromagnet. In addition, in the MEMS technology disclosed in the above example, for example, the modulated voltage of about several volts to one hundred and several tens of volts is applied to the oscillation mechanism, called a "comb-shaped electrostatic actuator," to oscillate the shutter. In the element using the MEMS technology, there are many cases in which, in order to downsize the device, the actuator member and the detection electrode are disposed close to each other such that the distance therebetween is, for example, 1 mm or shorter. Therefore, the detection signal is greatly susceptible to noises generated by the driving signal.

SUMMARY OF THE INVENTION

The present invention has been made in view of the above circumstances, and the present invention is directed to a potential measuring device for measuring a potential of a measurement object, the device comprising a detection electrode, a reference electrode, an electrostatic shield structure for electrostatically shielding the reference electrode with respect to the measurement object a capacitance modulator for modulating an electrostatic coupled capacitance between the detection electrode and the measurement object, and a measuring circuit for measuring a potential of the measurement object by using an electrical signal generated on the detection electrode and an electrical signal generated on the reference electrode. As the reference electrode, a member having an appropriate area and shape exhibits the effect of reducing the signal noise, regardless of the degree of noise reduction. In order to make the magnitude of noise generated on the detection electrode to be substantially equal to the magnitude of noise generated on the reference electrode, it is generally preferable that the reference electrode and the detection electrode be made substantially identical in shape.

In the present invention, "electrostatically shielding" is not limited only to a case of perfectly shielding the reference electrode from an influence that is electrostatically caused, but includes a case of shielding the reference electrode while allowing leakage to some degree, as long as the effect of reducing the signal noise is substantially obtained.

The constituent feature of the present invention can be applied to a potential measuring device for modulating the coupled electrostatic capacitance by using a chopper in the above conventional art, as well as a potential measuring device using a system of modulating the coupled electrostatic capacitance by modulating the distance between the detection electrode and the measurement object.

For example, the capacitance modulator includes an oscillating body axially supported by a torsion spring to be capable of oscillating around the torsion spring, and the detection electrode and the reference electrode disposed on a surface of the oscillating body, the areas and the shapes of the detection electrode and the reference electrode being substantially the same. The electrostatic capacitance between the detection electrode and the measurement object is changed by changing the distance between the detection electrode and the measurement object according to oscillation of the oscillating body for causing the detection electrode to generate an electrical output signal to conduct detection. In addition, a grounded electrostatic shield structure is inserted between the reference electrode and the potential measurement object to allow the reference electrode to generate only a noise attributable to an actuator (capacitance modulator).

Also, in view of the above circumstances, the present invention provides an image forming apparatus, including the potential measuring device and an image forming device, in which the surface of the detection electrode of the potential measuring device is disposed so as to face a surface of the image forming device which is to be subjected to potential measurement, and the image forming means performs control on image formation by using a signal detected by the potential measurement device. The image forming means may have a copying function, a printing function, a facsimile function, or the like.

Also, the present invention provides a method of measuring a potential of a measurement object comprising preparing a potential measuring device having a detection electrode disposed to face the measurement object and a reference electrode disposed in a vicinity of the detection electrode, and an electrostatic shield structure for electrostatically shielding the reference electrode with reference to the measurement object, modulating an electrostatic coupled capacitance between the detection electrode and the measurement object, detecting a first electrical signal generated on the detection electrode, detecting a second electrical signal generated on the reference electrode, and measuring the potential of the measurement object on the basis of the first electrical signal and the second electrical signal.

DETAILED DESCRIPTION OF THE EMBODIMENTS

Now, a description will be given in more detail of embodiments of the present invention with reference to the accompanying drawings.

First Embodiment

Figure 1:
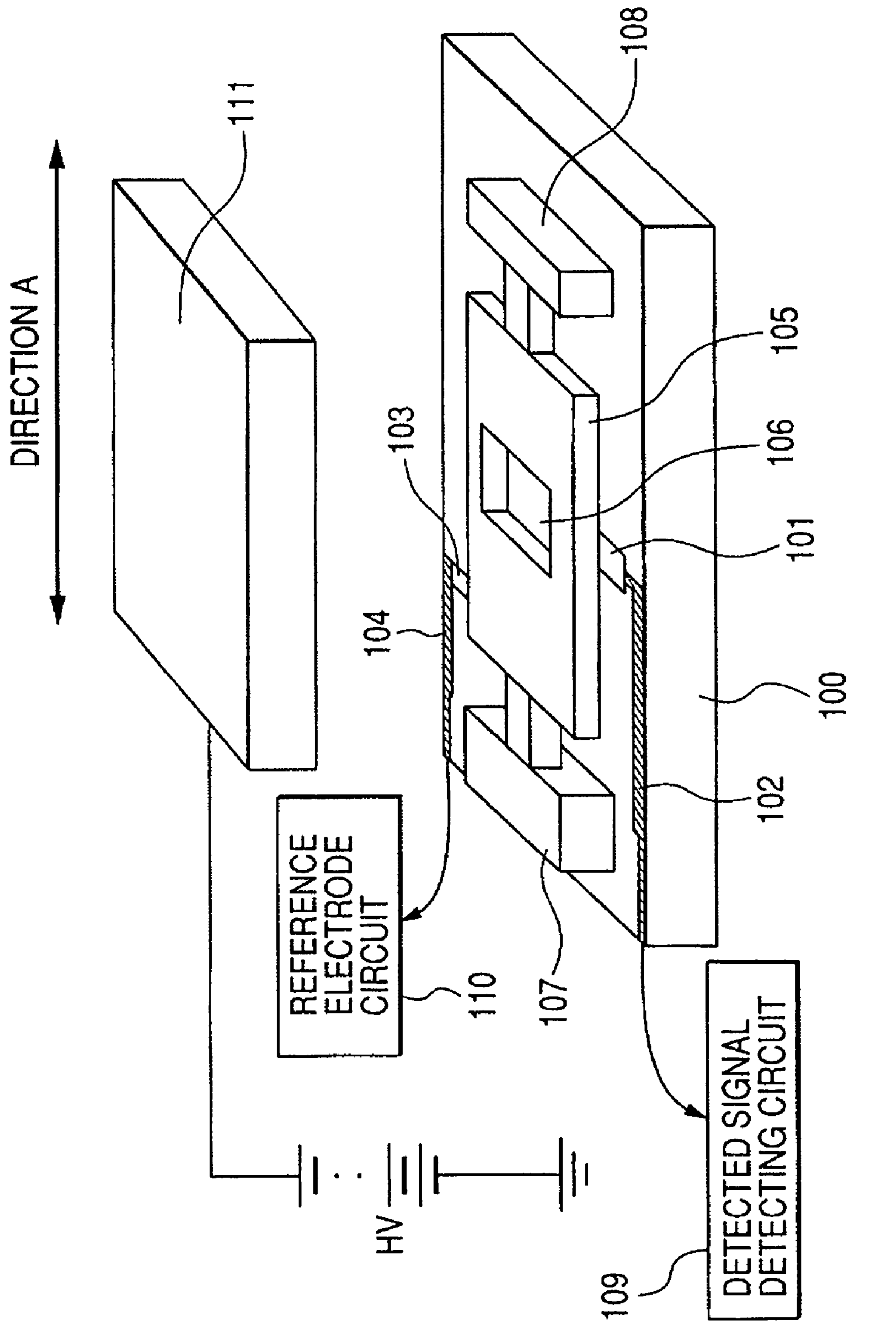
FIG. 1 is a diagram showing a structure of a potential measuring device according to a first embodiment of the present invention, and a positional relationship between the potential measuring device and a measurement object.

A first embodiment of the present invention will be described with reference to FIGS. 1 and 2. FIG. 1 shows the overall structure of a potential measuring device according to the present invention. Referring to FIG. 1, a signal detection electrode 101, a detection electrode wiring 102, a reference electrode 103, and a reference electrode wiring 104 are formed on a surface of a substrate 100. A measurement object 111 is disposed above the detection electrode 101 and the reference electrode 103. Also, disposed on the substrate 100 are an oscillating body 105 that cyclically oscillates, a driving mechanism 107 for oscillating the oscillating body, and a holding mechanism 108 for holding the oscillating body in midair so as not to be in contact with either of the detection electrode 101 and the reference electrode 103. The oscillating body 105 has an aperture 106. The combination of the oscillating body 105 and the aperture 106 corresponds to a shutter in the above conventional art, and, therefore, will also be called a "shutter" in the following description. In this example, the oscillating body 105 has a function of an electrostatic shield structure, which is constantly disposed between the reference electrode 103 and the measurement object 111, and is grounded with respect to the reference electrode 103.

A measuring circuit comprises a detected signal detecting circuit 109 and a reference electrode circuit 110. A signal generated on the signal detection electrode 101 is outputted to the detected signal detecting circuit 109 through the wiring 102, and a signal generated by the reference electrode 103 is outputted to the reference electrode 110 through the wiring 104, respectively.

Figure 2A:
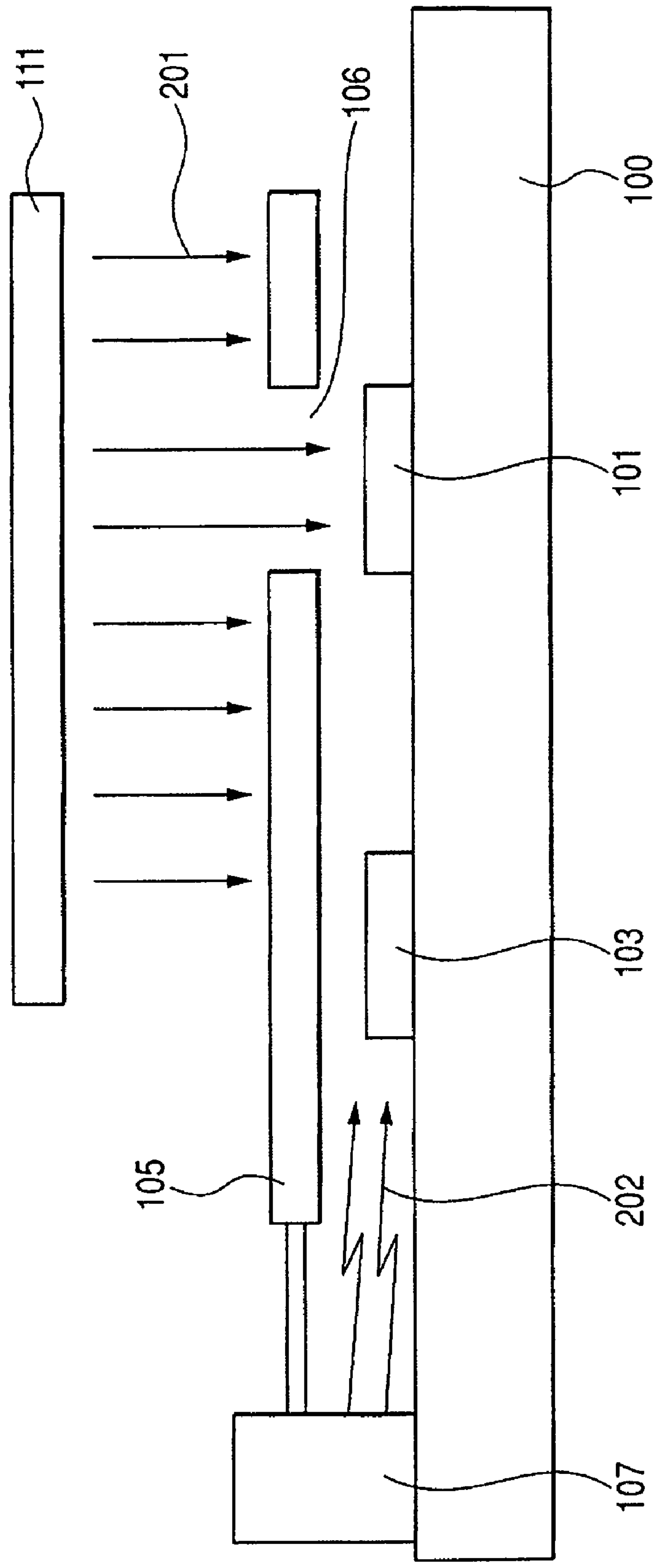
FIG. 2A is a cross-sectional view of an arrangement relationship among a detection electrode, a reference electrode, and a shutter, when the potential measuring device according to the first embodiment of the present invention is in operation.
Figure 2B:
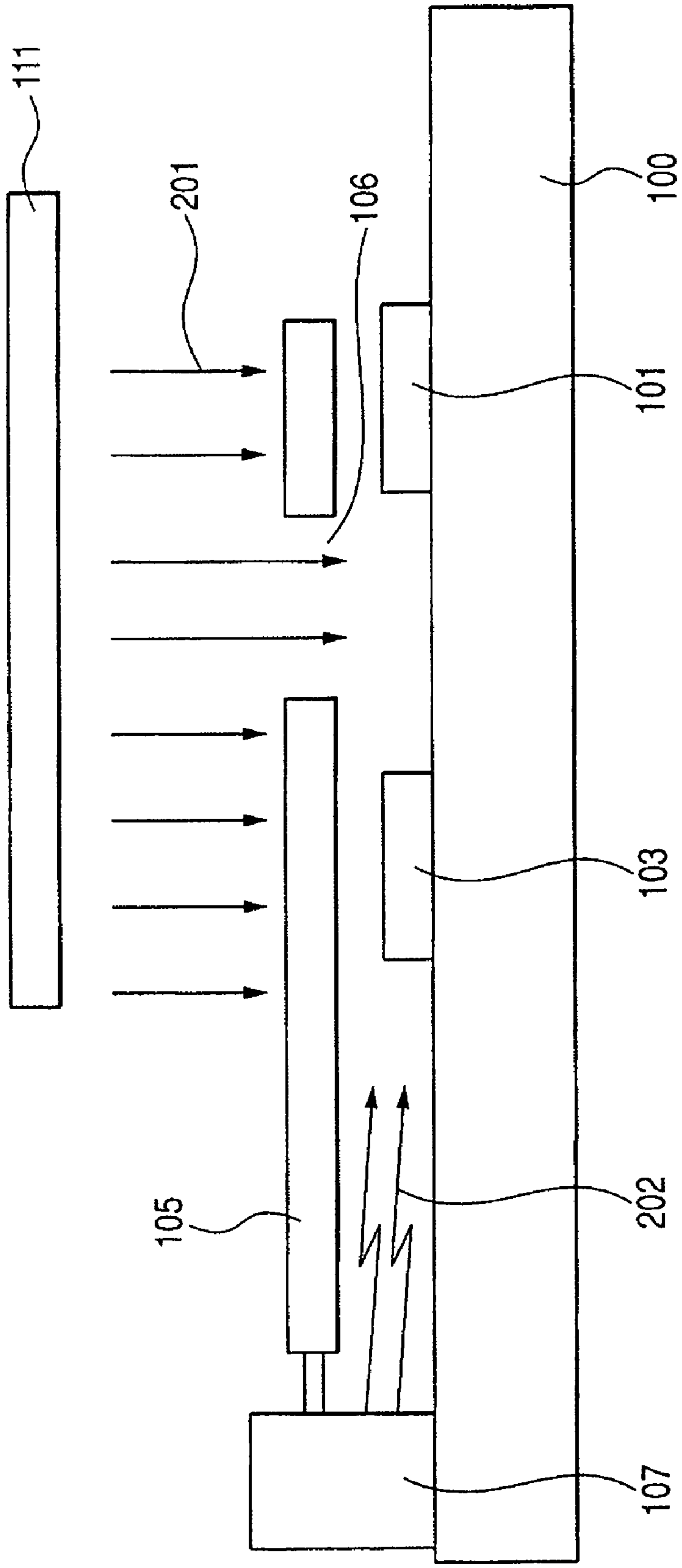
FIG. 2B is a cross-sectional view of the arrangement relationship among the detection electrode, the reference electrode, and the shutter, when the potential measuring device according to the first embodiment of the present invention is in operation.

FIGS. 2A and 2B each schematically show a sectional view of the positional relationship among the detection electrode 101, the reference electrode 103, the oscillating body 105, and the aperture 106 of the potential measuring device during operation according to the first embodiment. In the state shown in FIG. 2A, when a voltage is applied to the measurement object 111, electrical force lines 201 are emitted from the measurement object 111 toward the detection electrode 101. In this state, a part of the electrical force lines 201 reaches the detection electrode 101 through the aperture 106, which is provided on the shutter (which is grounded). The electrical force lines induce electrical charges on the detection electrode 101. In this situation, the charge quantity generated on the detection electrode 101 changes according to the magnitude of the potential of the measurement object 111. This state can be defined as a state in which the shutter is opened with respect to the detection electrode 101.

On the other hand, FIG. 2B shows a state after the aperture 106 of the oscillating body 105 is moved by the driving mechanism 107 so as to be positioned between the detection electrode 101 and the reference electrode 103. The electrical force lines 201 emitted from the measurement object 111 are shielded by the oscillating body 105, and do not reach the detection electrode 101. This state can be defined as a state in which the shutter is closed with respect to the detection electrode 101.

It should be noted that the downsized potential measuring device using the MEMS technology frequently uses a structure called a "comb-shaped electrostatic actuator" as the driving mechanism 107. The mechanism requires a high voltage of about several volts to one hundred and several tens of volts, which develops an electrostatic electromagnetic field 202 with the result that noises occur in the detection electrode 101 and the reference electrode 103.

In the electrostatic shutter structure using the MEMS technology described in this embodiment, the oscillation amplitude of the shutter is generally small, that is, several μm to 20 μm, and, therefore, the distance between the detection electrode 101 and the reference electrode 103 is very small, that is, about 100 μm or less. On the contrary, the distances between the respective electrodes and the electrostatic actuator 107 are several hundreds of μm to about 1 mm. Accordingly, noises that have been generated at the electrostatic actuator are generated with substantially the same magnitude and phase in the detection electrode 101 and the reference electrode 103, which are disposed in the vicinity of each other and have substantially the same shape, respectively.

In this embodiment, it is assumed that a sine wave driving signal is supplied to the electrostatic actuator (driving mechanism 107) to conduct the opening and closing operation of the shutter structure in a sine wave fashion. Noise signals that are expressed by the following expression are generated on the detection electrode 101 and the reference electrode 103 by the electromagnetic waves generated by the electrostatic actuator.

$$N(t)=N_0\cdot\sin(\omega\cdot t) \tag{3}$$

where N(t) is a noise signal that is generated in each of the electrodes (the detection electrode 101 and the reference electrode 103) at a time t, $N_0$ is a proportional constant, and ω is the angular frequency of the sine wave signal that is supplied to the electrostatic actuator.

A signal generated in the detection electrode 101 is expressed by the following expression on the basis of the potential of the measurement object 111, the positional relationship between the aperture 106 provided in the shutter and the detection electrode 101, and the electrical force lines emitted from the measurement object 111.

$$S_0(t)=A\cdot C\cdot\frac{\sin(\omega\cdot t+\varphi_0)+1}{2}\cdot V \tag{4}$$

where $S_0(t)$ is the magnitude of a signal induced by the measurement object 111, which is generated on the detection electrode 101 at the time t, A is a proportional constant, C is a maximum value of a coupled capacitance, which is developed between the detection electrode 101 and the measurement object 111, V is the potential of the measurement object 111, and $\psi_0$ is a phase difference term.

As a result, a signal $S_{101}$ generated on the detection electrode 101 is expressed by the following expression based on the electrical force lines from the measurement object 111 and the noises from the actuator.

$$S_{101}(t)=S_0(t)+N(t) \tag{5}$$

On the other hand, a signal $S_{103}$ generated on the reference electrode 103 hardly includes a signal derived from the measurement object 111, and, thus, includes only a signal derived from the noises, which is expressed by the following expression.

$$S_{103}(t)=N(t) \tag{6}$$

Accordingly, the following expression is obtained by using the detected signal detecting circuit 109 and the reference electrode circuit 110, which are shown in FIG. 1, and an appropriate calculating circuit (for example, a differential amplifying circuit).

$$\begin{aligned} S(t) &= S_{101}(t) - S_{103}(t) \\ &= S_0(t) \\ &= A \cdot C \cdot \frac{\sin(\omega \cdot t + \varphi_0) + 1}{2} \cdot V \end{aligned} \tag{7}$$

In the above manner, only the signal S(t), which is derived from the measurement object 111, which is not affected by the noise N(t) (or hardly affected), can be obtained.

In this embodiment, there may be a case in which the magnitudes of the signals that are generated by the noises derived from the actuator, which are generated in the detection electrode 101 and in the reference electrode 103, are different from each other due to an error that occurs in manufacturing the potential measuring device. In this case, the following expression is obtained when a signal derived from the noises occurring on the detection electrode 101 is $N_{101}(t)$, and a signal derived from the noises occurring on the reference electrode 103 is $N_{103}(t)$.

$$N_{101}(t)=\alpha \cdot N_{103}(t) \tag{8}$$

where α is a proportional constant. The proportional constant α becomes a value inherent to each potential measuring device, because it is affected by the arrangement and shape of the electrode due to a manufacturing error, but does not change with time. Accordingly, the value α is obtained with respect to each device, and processed by an appropriate calculating circuit, thereby making it possible to conduct an equivalent processing as the expression (7) by the expression (9). As a result, it is possible to finally obtain only the signal S'(t) that is derived from the measurement object 111.

$$\begin{aligned} S'(t) &= S'_{101}(t) - \alpha \cdot S'_{103}(t) \\ &= \{S'_0(t) + N_{101}(t)\} - \alpha \cdot N_{103}(t) \\ &= \{S'_0(t) + N_{101}(t)\} - N_{101}(t) \\ &= S'_0(t) \\ &= A' \cdot C \cdot \frac{\sin(\omega \cdot t + \varphi_0) + 1}{2} \cdot V \end{aligned} \tag{9}$$

where symbols with subscript "'" in the expression (9) mean a case in which the potential measuring device according this embodiment includes a manufacturing error.

In the above manner, according to this embodiment, because the detection electrode and the reference electrode have substantially the same shape, and are located in the vicinity of each other, the magnitudes of the noises occurring on both of the detection and reference electrodes, which are attributable to the actuator, can be made substantially equal to each other. As a result, even in a downsized potential measuring device, in which the actuator and the detection electrode are provided close to each other, the potential of the potential measurement object can be measured with relatively high measurement precision, sensitivity, and reliability.

Second Embodiment

A second embodiment according to the present invention will be described with reference to FIGS. 3, 4A, and 4B. The second embodiment has a structure in which a plurality of combinations of the detection electrode, the reference electrode, and the aperture, which is provided in the oscillating body according to the first embodiment, are located on the same substrate.

In general, one of the methods to enhance the detection sensitivity of the potential measuring device is to increase the area of the detection electrode. However, a chopper for modulating the electrical force lines from the measurement object is also made larger as the area of the detection electrode is increased, resulting in disadvantages, such as an increase in the power consumption or a reduction in the driving frequency. Under the circumstances, a method is employed in which a large number of small detection electrodes are arranged to increase the total area of the detection electrodes, the detection sensitivity is enhanced, as in the method of using the detection electrode with a large area. In this example, a chopper of a small size is attached onto the respective divided detection electrodes, which eliminates the need to increase the size of the chopper. As a result, it is possible to prevent an increase in the power consumption and a reduction in the driving frequency.

However, in the case where a plurality of choppers and driving mechanisms, which are shown in the first embodiment, are provided, a complicated control mechanism is required to control such that all of the choppers conduct the same operation at the same time. Under the circumstances, in the second embodiment, a single shutter (oscillating body) having a structure in which a large number of windows are open is used, instead of arranging the large number of choppers.

Figure 3:
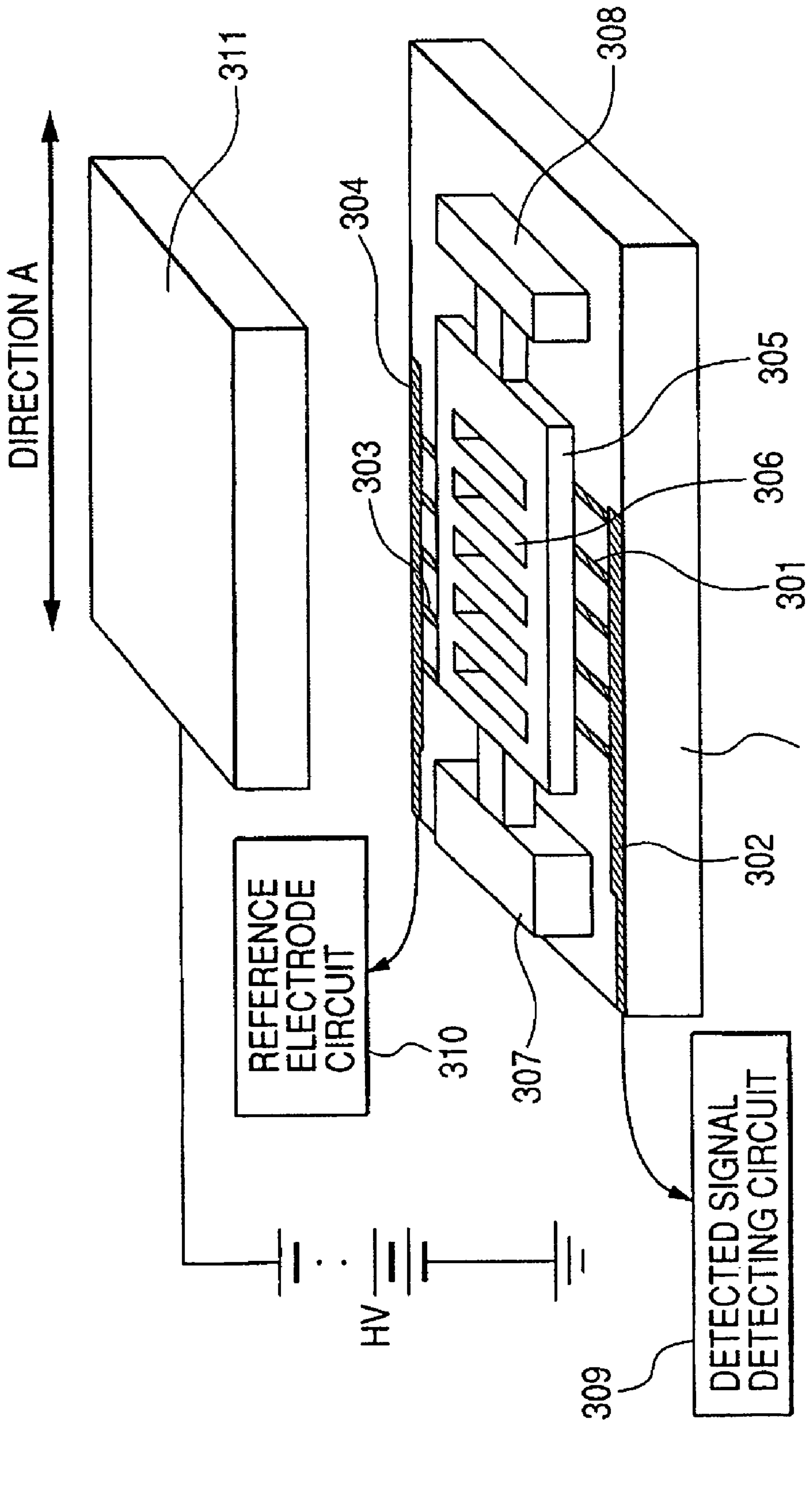
FIG. 3 is a diagram showing a structure of a potential measuring device according to a second embodiment of the present invention, and a positional relationship between the potential measuring device and a measurement object.

FIG. 3 shows an overall structure of a potential measuring device according to a second embodiment. In this embodiment, the respective structural elements basically have the same names and functions as those of corresponding elements in the first embodiment. That is, a flat surface 300 corresponds to the substrate 100, a signal detection electrode 301 corresponds to the signal detection electrode 101, a detection electrode wiring 302 corresponds to the detection electrode wiring 102, a reference electrode 303 corresponds to the reference electrode 103, and a reference electrode wiring 304 corresponds to the reference electrode wiring 104. In addition, an oscillating body 305 corresponds to the oscillating body 105, an aperture 306 corresponds to the aperture 106, a driving mechanism 307 corresponds to the driving mechanism 107, a holding mechanism 308 corresponds to the holding mechanism 108, a detecting signal detecting circuit 309 corresponds to the detected signal detecting circuit 109, and a reference electrode circuit 310 corresponds to the reference electrode 110. In the second embodiment, the detection electrodes 301, the reference electrode 303, and the apertures 306 are cyclically disposed as a plurality of pairs.

Figure 4A:
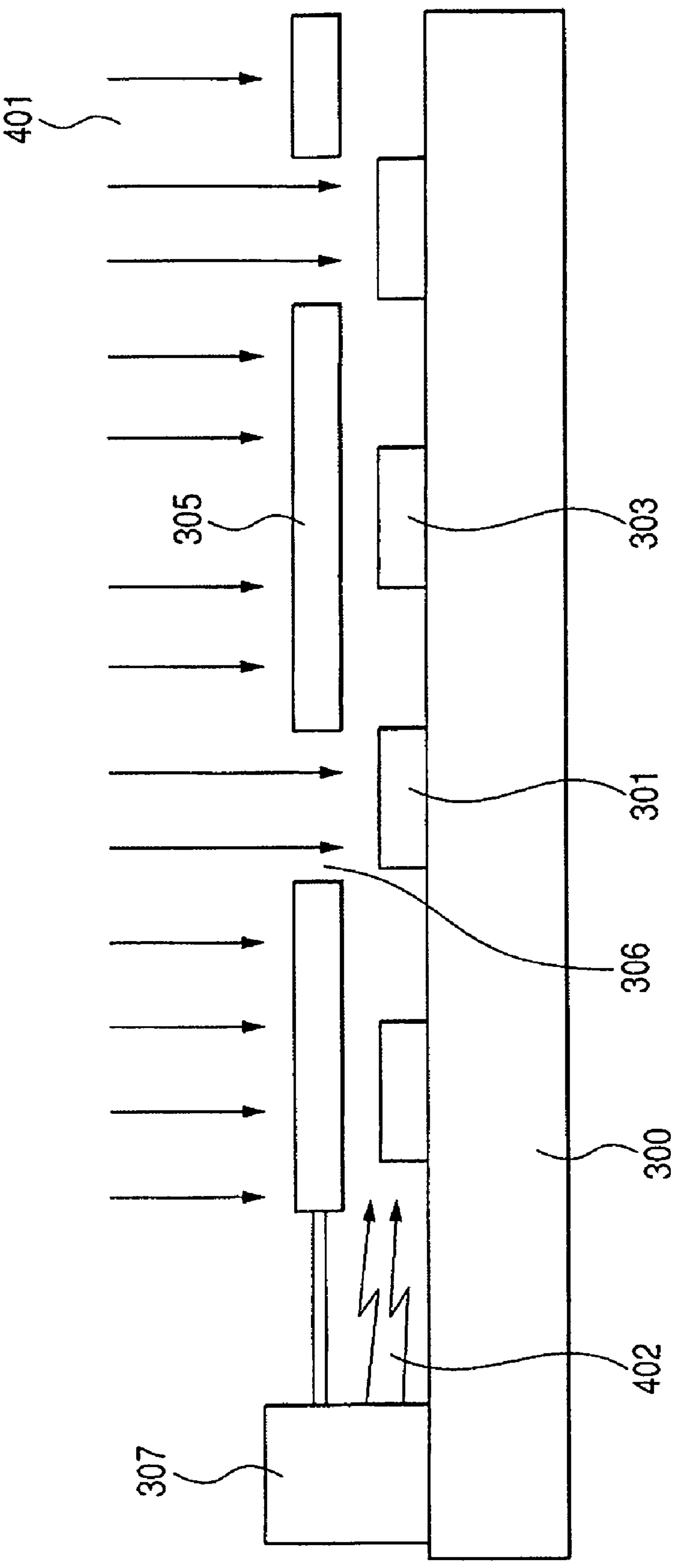
FIG. 4A is a cross-sectional view of an arrangement relationship among a detection electrode, a reference electrode, and a shutter, when the potential measuring device according to the second embodiment of the present invention is in operation.
Figure 4B:
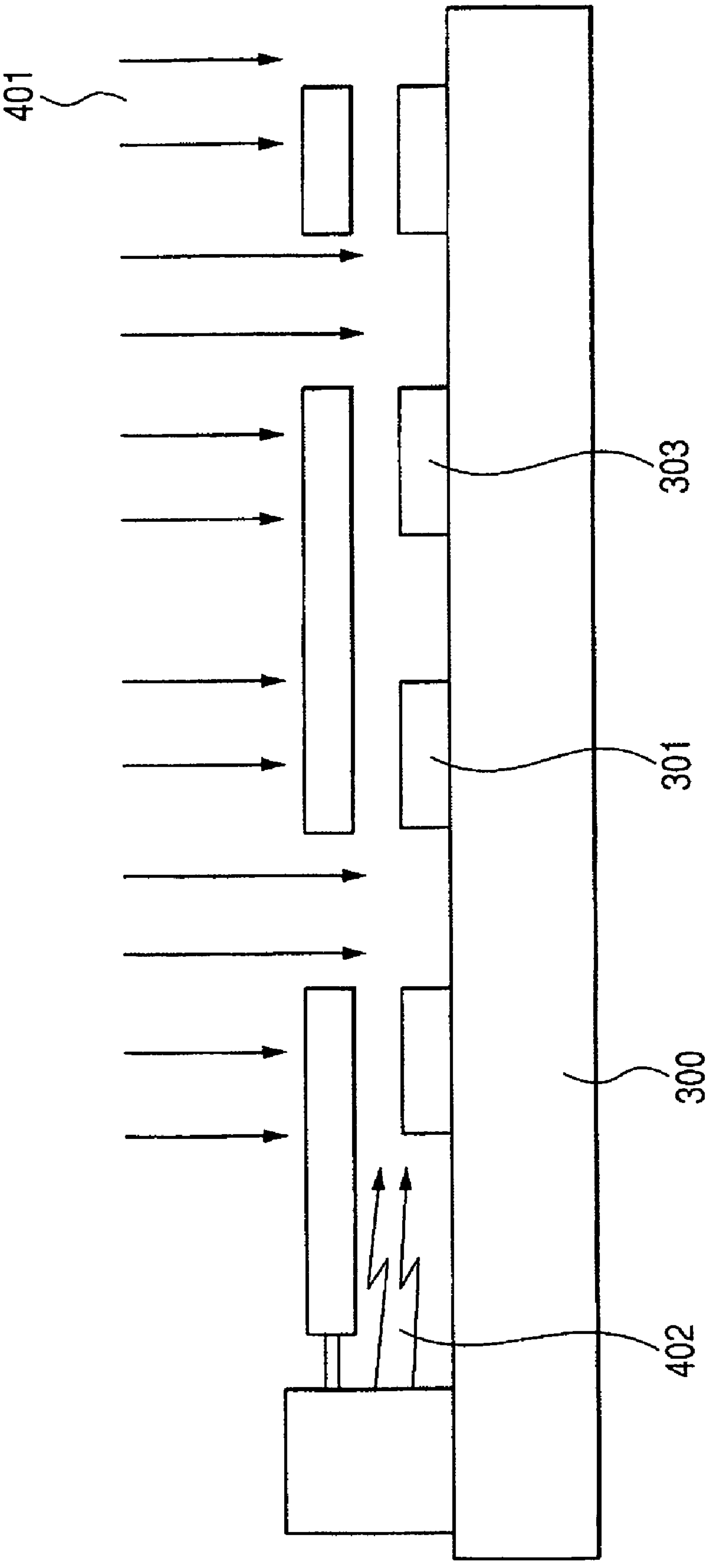
FIG. 4B is a cross-sectional view of the arrangement relationship among the detection electrode, the reference electrode, and the shutter, when the potential measuring device according to the second embodiment of the present invention is in operation.

FIGS. 4A and 4B each schematically show a sectional view of the positional relationship between the detection electrode 301, the reference electrode 303, the oscillating body 305, and the aperture 306, during the operation of the potential measuring device, according to the second embodiment.

The electrical force lines 401 emitted from the measurement object 311 reach the detection electrode 301 through the plurality of apertures 306 that are provided in the shutter when the shutter is in an opened state (a state shown in FIG. 4A). On the other hand, the electrical force lines 401 do not reach the detection electrode 301 when the shutter is in a closed state (a state shown in FIG. 4B). In this situation, even in both of the opened and closed states, the electrical force lines 401 are arranged so as not to reach the reference electrode 303.

In this embodiment, noise component signals are generated in the detection electrode 301 and the reference electrode 303 due to the electromagnetic wave 402 generated from the actuator 307 for cyclically moving the oscillating body 305, as in the first embodiment. However, it is possible to remove the noise component from the detection signal by employing the same manner as that described in the first embodiment.

Third Embodiment

Figure 5:
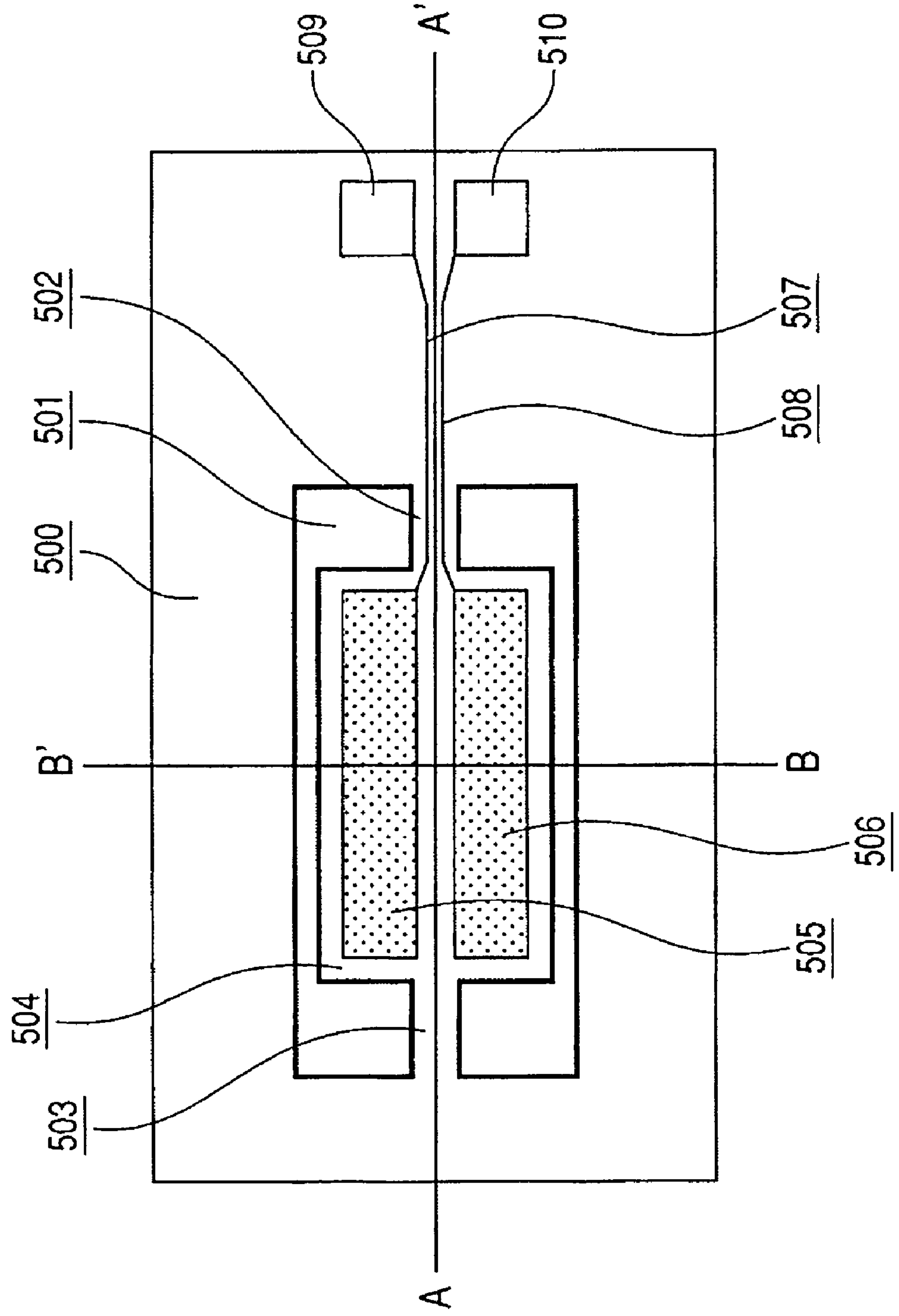
FIG. 5 is a schematic top view of a potential measuring device according to a third embodiment of the present invention.

A third embodiment according to the present invention will be described with reference to FIGS. 5, 6, and 7A to 7C. FIG. 5 shows a structure of a potential measuring device according to a third embodiment of the present invention. An aperture 501 is formed in a center of a support substrate 500, and a flat oscillating body 504 is supported in a central hollow portion of the aperture 501 by two torsion springs 502 and 503. The oscillating body 504 has an axisymmetric structure with respect to the center line A-A' that connects center lines of the torsion springs 502 and 502 in the longitudinal axial direction.

On one surface of the oscillating body 504, a pair of a flat detection electrode 505 and a flat reference electrode 506, which have substantially the same shape, are arranged axisymmetrically with respect to the center line A-A'. Both of the electrodes 505 and 506 are connected to extraction electrodes 509 and 510 that are formed on the support substrate 500 by both of electrode wirings 507 and 508 formed on the torsion spring 502. Both of the extraction electrodes 509 and 510 are connected to an external appropriate circuit (refer to the detected signal detecting circuit and the reference electrode circuit) (not shown).

Figure 6:
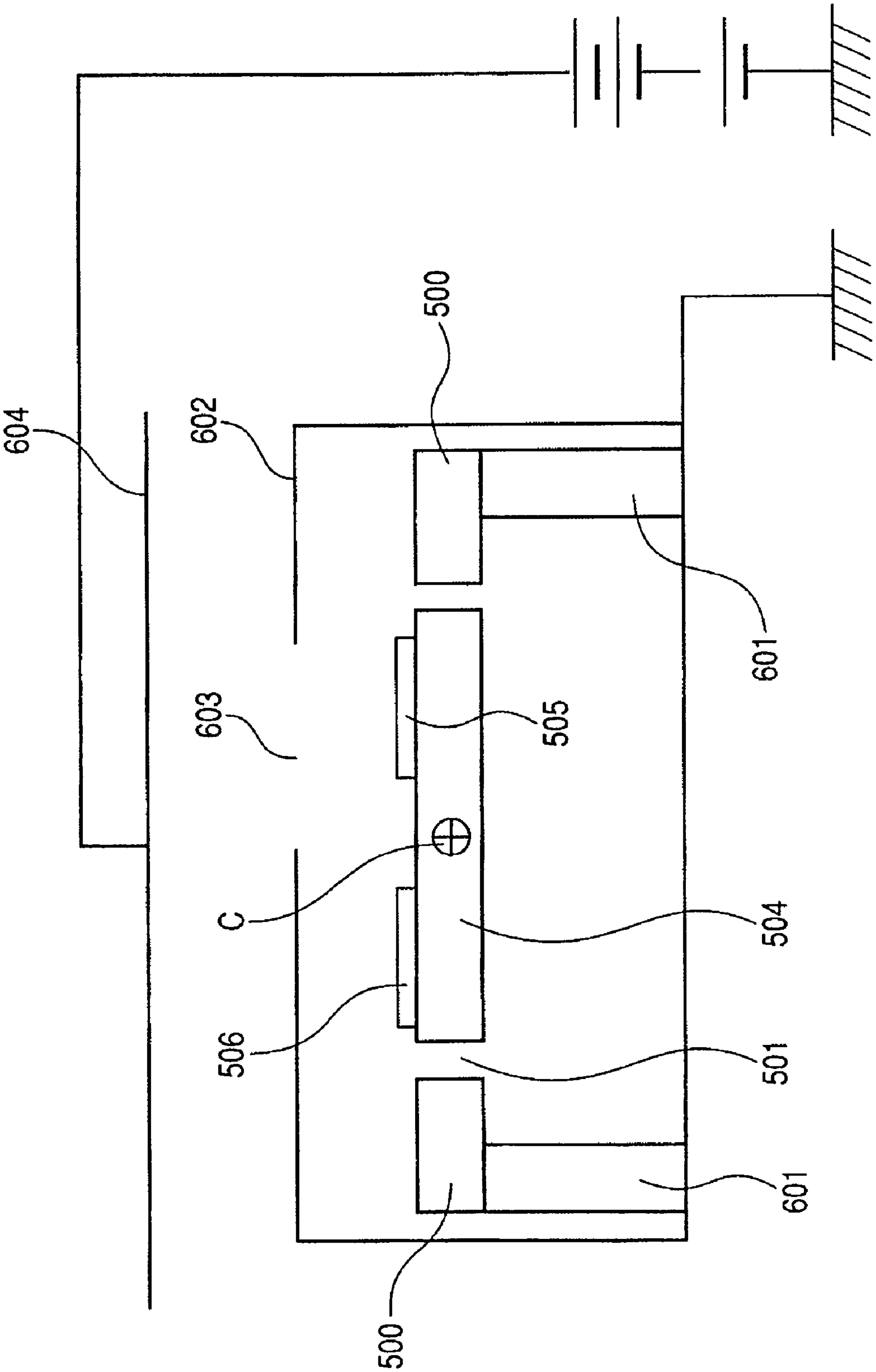
FIG. 6 is a cross-sectional view of a positional relationship between a potential measuring device and a measurement object according to the third embodiment of the present invention.

FIG. 6, a cross-sectional view taken along the line B-B' of FIG. 5, shows a state in which the potential measuring device of FIG. 5 is arranged with respect to a measurement object surface 604. In a case in which the measurement object surface 604 facing the oscillating body 504 is substantially planar, the oscillating body 504 is disposed so as to be substantially in parallel to the measurement object surface 604 at a neutral position. Referring to FIG. 6, reference numeral 602 denotes a case for storing the potential measuring device. The case 602 is made of a conductive material and earthed. The support substrate 500 for supporting the oscillating body 504 is fixed onto the case 602 by means of an appropriate mounting jig 601. An aperture 603 is formed in the case 602 at a position between the detection electrode 505 and the measurement object surface 604. On the other hand, the case 602 perfectly shields the reference electrode 506 with respect to the measurement object surface 604, which corresponds to the above electrostatic shield structure.

An appropriate oscillating body driving mechanism is additionally provided to the potential measuring device, and shapes and materials of the oscillating body 504 and the torsion springs 502 and 503 are appropriately selected, to thereby cyclically oscillate the oscillating body 504 with the center axial line C of the torsion springs 502 and 503 as a center of rotation. Those elements constitute the above capacitance modulation means (capacitance modulator).

Figures 7A, 7B, 7C:
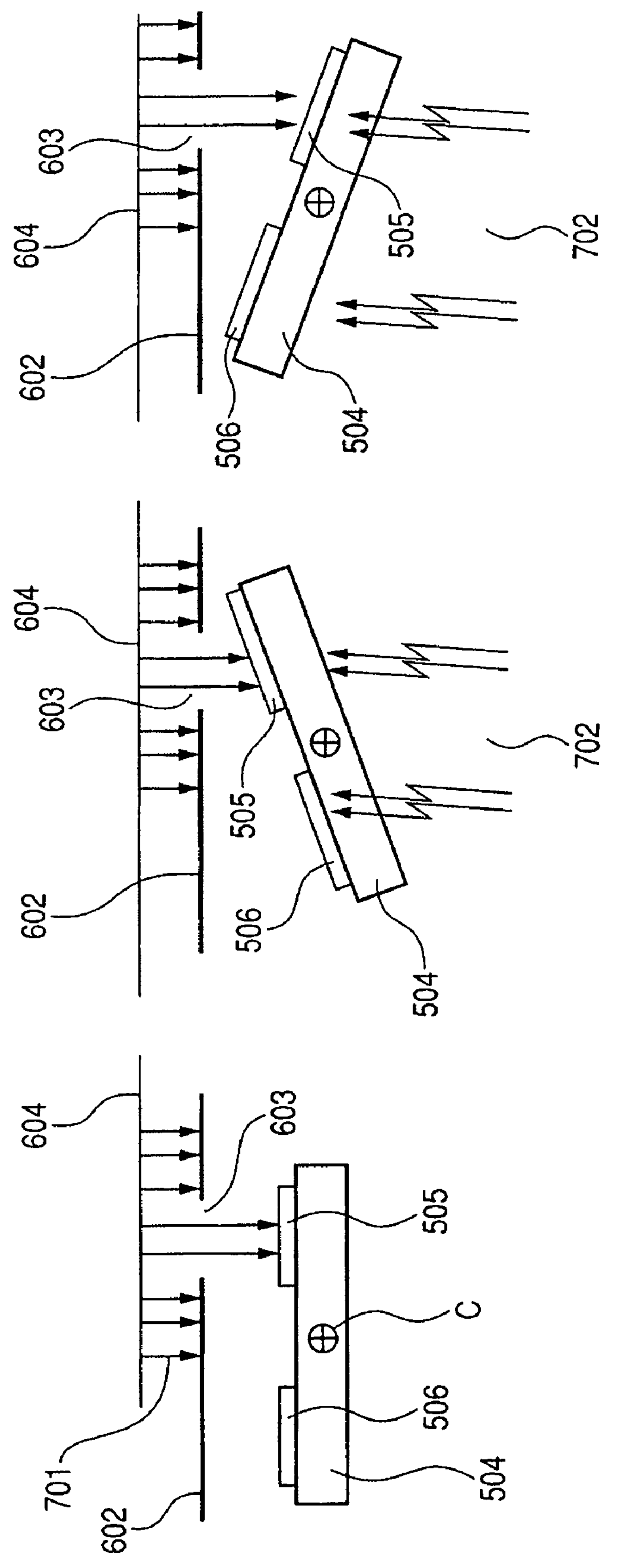
FIGS. 7A, 7B and 7C are each a diagram for explaining positional relationships between the respective parts and the measurement object when an oscillating body oscillates in the third embodiment of the present invention.

FIGS. 7A to 7C are each a sectional view taken along the line B-B' of FIG. 5, which schematically show how the oscillating body 504 oscillates. FIG. 7A shows a state in which the oscillating body 504 is in a stationary state or has arrived at the same position as that of the stationary state during oscillation (neutral state).

In the state shown in FIG. 7A, when the measurement object 604 has a potential, the electrical lines of force 701 are emitted from the measurement object 604 to reach the detection electrode 505 through the aperture 603 provided in the case 602. Then, the electrical charges Q, which correspond to the following expression (10), obtained from a combination of the above expressions (1) and (2), are induced on the detection electrode 505.

$$Q = C \cdot V = \frac{A \cdot S}{x} \cdot V \qquad (1)$$

where Q is a charge quantity that appears on the detection electrode 505, C a coupled capacitance between the detection electrode 505 and the measurement object 604, V a potential of the surface of the measurement object 604, A a proportional constant, S an area of the detection electrode 505, x a distance between the detection electrode 505 and the measurement object surface 604.

FIG. 7B shows a state in which the oscillating body 504 has oscillated so that the average distance between the detection electrode 505 and the measurement object 604 is shortest. On the other hand, FIG. 7C shows a state in which the oscillating state of the oscillating body 504 has changed so that the average distance between the detection electrode 505 and the measurement object 604 is largest. In this way, the oscillating body 504 is cyclically oscillated appropriately, to thereby modulate the average distance x between the detection electrode 505 and the measurement object surface 604. As a result, the electrical charge Q on the detection electrode 505, which is expressed by the expression (10), is modulated to process the signal thereof, which makes it possible to obtain the potential of the measurement object surface 604.

On the other hand, the position of the reference electrode 506 changes with the oscillation of the oscillating body 504 during the above operation of the oscillating body 504, but the case 602 shields the electrical lines of force emitted from the measurement object surface 604. Therefore, the electrical charges corresponding to the potential of the measurement object surface 604 are hardly induced on the reference electrode 506.

In the third embodiment, an actuator using an electrostatic force or an electromagnetic force is used in order to oscillate the oscillating body 504, as in the first and second embodiments. Therefore, an electromagnetic wave 702 is generated from the actuator, and a noise component signal is generated in the detection electrode 505 and the reference electrode 506. However, the noise component can be removed from the detection signal by using the same manner as that described in the first embodiment. In this embodiment, the detection electrode 505 and the reference electrode 506 have substantially the same positional relationship with respect to the actuator.

Fourth Embodiment

Figure 8:
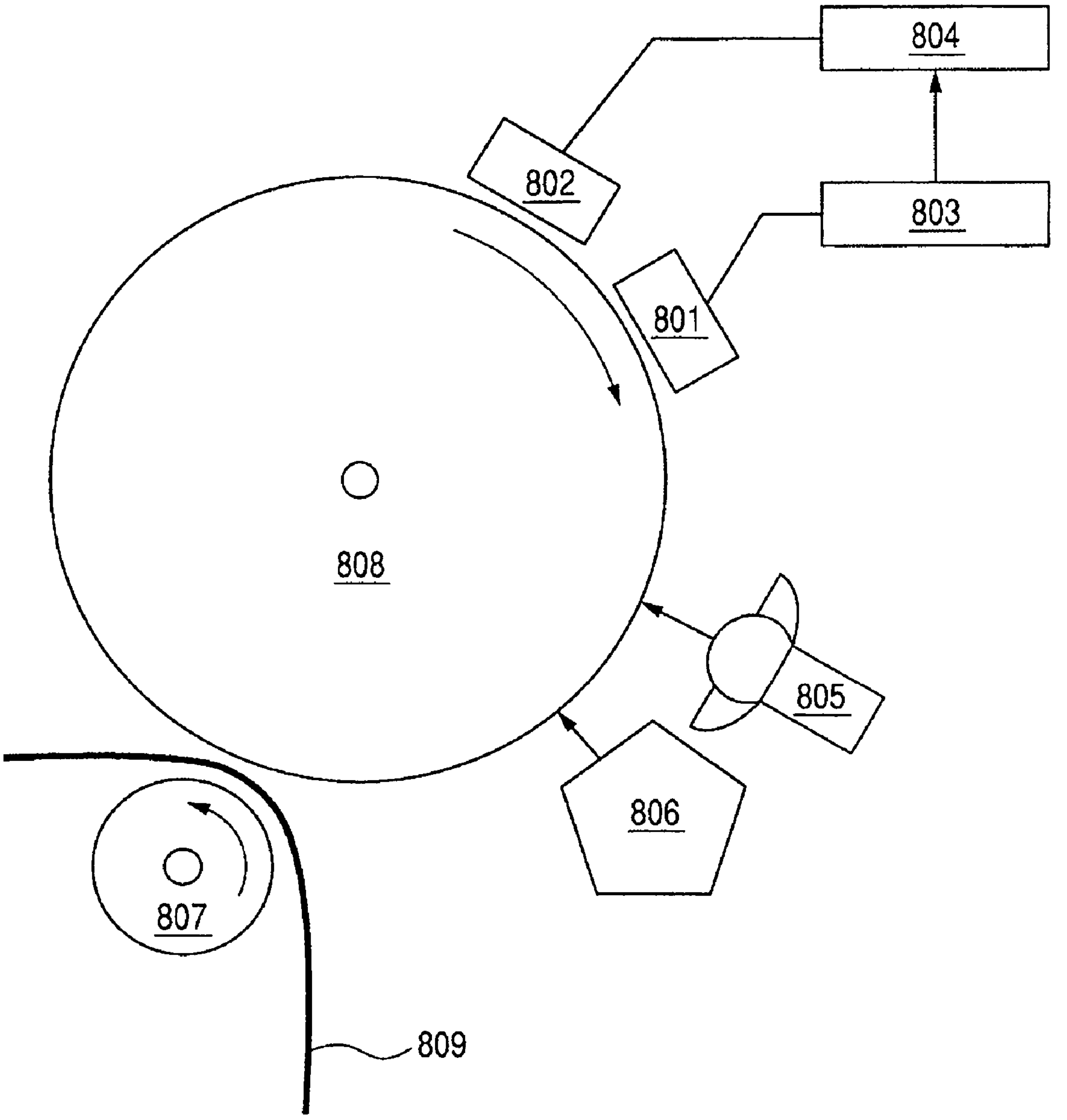
FIG. 8 is a schematic structural diagram showing an image forming apparatus according to an embodiment into which the potential measuring device of the present invention is incorporated.

FIG. 8 is a diagram for explaining an image forming apparatus according to a fourth embodiment. FIG. 8 is a schematic diagram showing a periphery of a photosensitive drum of an electrophotography developing apparatus using the potential measuring device of the present invention. A charger 802, a potential measuring device 801, an exposure device 805, and a toner supply device 806 are provided around a photosensitive drum 808. A surface of the drum 808 is charged by the charger 802 and the surface of the photosensitive drum 808 is exposed by using the exposure device 805 to thereby obtain a latent image. Toners are adhered to the latent image by the toner supply device 806 to obtain a toner image. Then, the toner image is transferred to a transfer product 809 interposed between a transfer object feed roller 807 and the photosensitive drum 808 to fix the toners on the transfer product 809. Image formation is achieved through the above processes.

In the above structure, the charged state of the photosensitive drum 808 is measured by the compact and high-performance potential measuring device 801 of the present invention, and the signal is processed by a signal processing device 803, and the charger 802 is controlled, for example, by conducting feedback on a high-voltage generator 804. As a result, the photosensitive drum 808 is stably charged to attain stable image formation. In this situation, an output of the potential measuring device 801 is monitored in synchronization with the rotation of the photosensitive drum 808, which makes it possible to obtain a potential distribution on the photosensitive drum. Then, the amount of light with which the photosensitive drum 808 is exposed is controlled, or the charger 802 is controlled on the basis of the potential distribution thus obtained, thereby making it possible to reduce unevenness in the image.

The potential measuring device according to the present invention may be applied to a system that is constituted of a plurality of devices (for example, a host computer, an interface device, a reader, or a printer), or may be applied to a device that is formed of one device (for example, a copying machine, or a facsimile machine).

In the present invention, a signal of the sum of a signal output derived from the potential of the measurement object and noises derived from an actuator (capacitance modulator) of electromagnetic, piezoelectric, or electrostatic ones, is generated on a detection electrode that faces a measurement object. Accordingly, it is possible to reduce the influence of the noises derived from the actuator on the detection signal by conducting processing for removing the component of the noise signal that occurs on the reference electrode provided in a vicinity of the detection electrode. Generally, the detection electrode and the reference electrode have substantially the same shape and are located close to each other, which can make the magnitudes of the noises generated on the detection electrode and the reference electrode due to the actuator to be substantially equal to each other. As a result, even in a downsized potential measuring device in which the distance between the actuator and the detection electrode is so small that the actuator and the detection electrode come close to each other, the potential of the potential measurement object can be measured with relatively high measurement precision, sensitivity, and reliability.

What is claimed is:

1. A potential measuring device for measuring a potential of a measurement object, said device comprising:

a detection electrode;

a reference electrode that is electrostatically shielded constantly during potential measurement by an electrostatic shield structure with respect to the measurement object;

a capacitance modulator for modulating an electrostatic coupled capacitance between said detection electrode and the measurement object; and a measuring circuit for measuring a potential of the measurement object by using an electrical signal generated on said detection electrode and an electrical signal generated on said reference electrode.

2. A potential measuring device according to claim 1, wherein said reference electrode has substantially the same shape as that of said detection electrode.

3. A potential measuring device according to claim 1, wherein said electrostatic shield structure is disposed between said reference electrode and the measurement object and is grounded.

4. A potential measuring device according to claim 1, wherein said capacitance modulator is a mechanical device which modulates the electrostatic coupled capacitance between said detection electrode and the measurement object.

5. A potential measuring device according to claim 4, wherein said capacitance modulator comprises a chopper for shielding, in a constant cycle, electrical force lines that are emitted from the measurement object to said detection electrode and a driving mechanism for driving the chopper.

6. A potential measuring device according to claim 5, wherein said chopper and said driving mechanism are located on a semiconductor substrate on which said detection electrode and said reference electrode are disposed.

7. A potential measuring device according to claim 4, wherein said capacitance modulator includes an oscillating body axially supported by a torsion spring to be capable of oscillating around the torsion spring, wherein said detection electrode and said reference electrode are disposed on a surface of said oscillating body, and wherein the electrostatic capacitance between said detection electrode and the measurement object is changed by changing the distance between said detection electrode and the measurement object through oscillation of said oscillating body to generate an electrical signal on said detection electrode.

8. A potential measuring device according to claim 1, wherein the electrostatic shield structure shields electric force lines that reach the reference electrode from the measurement object.

9. A potential measuring device according to claim 1, wherein the reference electrode substantially generates only a noise attributable to an actuator.

10. An image forming apparatus comprising:

a potential measuring device according to claim 1; and an image forming device, wherein a surface of said detection electrode of said potential measuring device is so disposed as to face a surface of said image forming device which is to be subjected to potential measurement, and wherein said image forming device performs control of image formation by using a potential measured by said potential measurement device.

11. A method of measuring a potential of a measurement object, said method comprising:

preparing a potential measuring device comprising a detection electrode disposed to face the measurement object, and a reference electrode that is disposed in a vicinity of the detection electrode and that is electrostatically shielded constantly during potential measurement by an electrostatic shield structure with respect to the measurement object;

modulating an electrostatic coupled capacitance between said detection electrode and the measurement object;

detecting a first electrical signal generated on said detection electrode;

detecting a second electrical signal generated on said reference electrode; and measuring the potential of the measurement object based on the first electrical signal and the second electrical signal.

12. A method of measuring a potential according to claim 11, wherein the electrostatic shield structure shields electric force lines that reach the reference electrode from the measurement object.

13. A method of measuring a potential according to claim 11, wherein the reference electrode substantially generates only a noise attributable to an actuator.

* * * * *